(12) United States Patent
Takahashi

(10) Patent No.: US 6,734,070 B1
(45) Date of Patent: May 11, 2004

(54) METHOD OF FABRICATING A SEMICONDUCTOR DEVICE WITH FIELD-EFFECT TRANSISTORS HAVING SHALLOW SOURCE AND DRAIN JUNCTIONS

(75) Inventor: Masashi Takahashi, Kanagawa (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/388,474

(22) Filed: Mar. 17, 2003

(51) Int. Cl.[7] ............... H01L 21/336; H01L 21/302; H01L 21/461
(52) U.S. Cl. ............... 438/300; 438/302; 438/692
(58) Field of Search ............... 438/692, 311, 438/706, 587, 299, 216, 300, 197, 302, 275

(56) References Cited

U.S. PATENT DOCUMENTS

| | | | | |
|---|---|---|---|---|
| 5,434,093 A | * | 7/1995 | Chau et al. | 438/300 |
| 5,966,597 A | * | 10/1999 | Wright | 438/197 |
| 6,155,537 A | * | 12/2000 | Yang | 254/314 |
| 6,184,116 B1 | * | 2/2001 | Shen et al. | 438/587 |
| 6,187,641 B1 | * | 2/2001 | Rodder et al. | 438/299 |
| 6,190,980 B1 | * | 2/2001 | Yu et al. | 438/302 |
| 6,207,485 B1 | * | 3/2001 | Gardner et al. | 438/216 |
| 6,214,681 B1 | * | 4/2001 | Yu | 438/300 |
| 6,218,716 B1 | * | 4/2001 | Wang et al. | 257/413 |
| 6,331,458 B1 | * | 12/2001 | Anjum et al. | 438/197 |
| 6,362,055 B2 | * | 3/2002 | Lin et al. | 438/275 |
| 6,403,485 B1 | * | 6/2002 | Quek et al. | 438/692 |
| 6,413,829 B1 | * | 7/2002 | Yu | 438/311 |
| 6,420,273 B1 | * | 7/2002 | Lin | 438/706 |
| 6,504,218 B1 | * | 1/2003 | Kadosh et al. | 257/369 |
| 6,566,696 B1 | * | 5/2003 | Cheek et al. | 257/269 |

FOREIGN PATENT DOCUMENTS

| | | |
|---|---|---|
| JP | 07-122746 | 5/1995 |
| JP | 2001-156289 | 6/2001 |

* cited by examiner

Primary Examiner—John F. Niebling
Assistant Examiner—Walter L. Lindsay, Jr.
(74) Attorney, Agent, or Firm—Volentine Francos, PLLC

(57) ABSTRACT

A field-effect transistor is fabricated by depositing and patterning a layer of a semiconductor material and a first dielectric film to form a gate electrode covered by the remaining part of the first dielectric film, depositing a second dielectric film to form sidewalls on the gate electrode and first dielectric film, implanting a first impurity into the substrate to form source and drain regions, forming a third dielectric film masking at least the inner parts of the source and drain regions while exposing the first dielectric film, removing the first dielectric film by etching, and implanting a second impurity into the gate electrode. The first and second impurities may be, for example, boron difluoride and boron, respectively. The implantation parameters can be adjusted to form shallow source and drain regions and form a fully doped gate electrode.

19 Claims, 7 Drawing Sheets

METHOD OF FABRICATING A SEMICONDUCTOR DEVICE WITH FIELD-EFFECT TRANSISTORS HAVING SHALLOW SOURCE AND DRAIN JUNCTIONS

BACKGROUND OF THE INVENTION

1. Field of the Invention

The present invention relates to a method of fabricating a semiconductor device, more particularly a method of fabricating a p-channel metal-oxide-semiconductor field-effect transistor (PMOSFET) in a semiconductor device.

2. Description of the Related Art

As semiconductor technology moves to increasing levels of large-scale integration and the dimensions of integrated field-effect transistors are increasingly reduced, the source and drain diffusions of the transistors must be made increasingly shallow to avoid deleterious short-channel effects. For PMOSFETs this presents a problem, because the boron ions implanted as an impurity to form the source and drain diffusions are small in mass and therefore penetrate comparatively deeply into the substrate during the implantation process.

One well-known solution to this problem is to reduce the boron ion implantation energy, but that also reduces the ion current, thus requiring a longer implantation time and delaying the fabrication process.

Another well-known solution is to implant boron difluoride ($BF_2$) ions, which are more massive than boron ions and can be implanted with greater energy to an identical depth. Conventional fabrication processes, however, implant the same impurity into the gate electrode as into the source and drain regions, and it has been found that the presence of fluorine in the gate electrode leads to penetration of the gate oxide film by boron atoms during the subsequent drive-in process. Unwanted boron then accumulates in the channel, region below the gate electrode, greatly altering the transistor threshold voltage.

Another known solution, disclosed in Japanese Unexamined Patent Application Publication No. 2001-156289, implants boron ions into the source and drain regions and gate electrode through a dielectric film, such as a film of silicon dioxide or silicon nitride eighty to one hundred eighty nanometers thick, covering the gate oxide film and the gate electrode. This process enables boron ions to be implanted with comparatively high energy to a comparatively shallow depth in the source and drain regions, without introducing unwanted fluorine into the gate electrode.

Measurements performed by the inventor on PMOSFETs fabricated by this process have disclosed a further problem, however. Optical measurements of the gate oxide film thickness disagree with electrical measurements of the gate capacitance, implying the existence of an unwanted parasitic capacitance in series with the capacitance due to the gate oxide film. The explanation for the discrepancy is thought to be that the shallowness of the source and drain diffusions is mirrored by a shallowness of the boron diffusion into the gate electrode leaving a depletion zone at the bottom of the gate electrode, near the gate oxide film. FIG. 25 is a sectional view showing the substrate 2, gate electrode 4, gate oxide film 6, and suspended depletion zone 8. The effect of the depletion zone 8 is to thicken the layer of insulation between the gate electrode 4 and substrate 2, reduce the total gate capacitance, and thus reduce the driving capability of the transistor.

The depletion zone could be eliminated by a lengthy high-temperature drive-in process, but this process would also deepen the source and drain diffusions, defeating the original purpose of the silicon dioxide or silicon nitride film, and would also tend to drive boron through the gate oxide film into the channel region.

SUMMARY OF THE INVENTION

An object of the present invention is to fabricate PMOSETs with shallow source and drain diffusions, without leaving a depletion zone in the gate electrodes.

When a field-effect transistor is fabricated according to the present invention, a gate oxide film is formed on a semiconductor substrate, a layer of a semiconductor material such as polysilicon is deposited on the gate oxide film, and a first dielectric film is formed on the layer of semiconductor material. The first dielectric film and the layer of semiconductor material are then patterned to form a gate electrode covered by a remaining part of the first dielectric film.

A second dielectric film is deposited to form sidewalls on the gate electrode and the remaining part of the first dielectric film, and a first impurity is implanted into the substrate through the gate oxide film to form source and drain regions.

A third dielectric film is now formed. The third dielectric film masks at least those part of the source and drain regions adjacent the gate electrode, while exposing the remaining part of the first dielectric film. The third dielectric film may be formed by, for example, oxidation of the surface of the substrate, chemical vapor deposition followed by patterning, or chemical vapor deposition followed by planarization or etch-back.

The remaining part of the first dielectric film is then removed by etching, and a second impurity is implanted into the gate electrode.

Boron difluoride may be implanted as the first impurity and boron as the second impurity.

A third impurity such as boron or boron difluoride may be implanted before the formation of the sidewalls, to create a lightly doped drain.

By implanting the first and second impurities separately, the invention enables the implanting conditions for the source and drain regions and the implanting conditions for the gate electrode to be optimized separately. The second impurity can thus be implanted to an adequate depth in the gate electrode while the first impurity is implanted to a shallow depth in the source and drain regions.

DETAILED DESCRIPTION OF THE INVENTION

Figure 1:
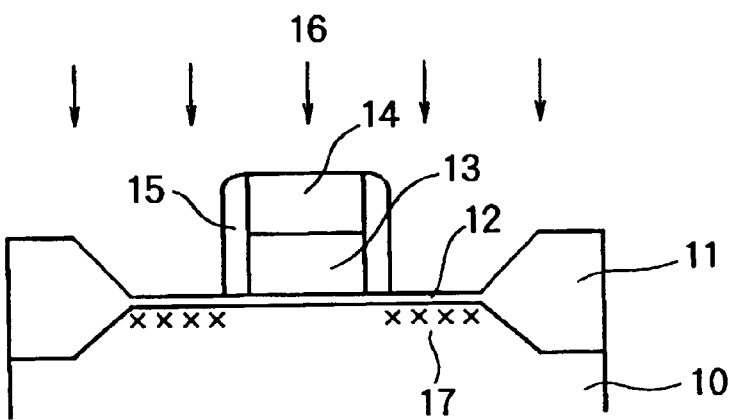
FIGS. 1, 2, and 3 are sectional views illustrating three stages in the formation of a PMOSFET according to a first embodiment of the invention.

Embodiments of the invention will now be described with reference to the attached drawings, in which like elements are indicated by like reference characters.

Referring to FIG. 1, in a first embodiment, a PMOSFET is formed on an n-type silicon well or substrate 10 as part of an integrated circuit fabricated on a silicon wafer. FIG. 1 and the other drawings show one small part of the wafer. Initial steps in the fabrication process create a comparatively thick field oxide layer 11, which isolates the PMOSFET from other circuit element nearby, and a comparatively thin gate oxide film 12. A polycrystalline silicon (polysilicon) film with a thickness of one hundred to five hundred nanometers (100–500 nm) is deposited on the gate oxide film 12. A silicon nitride (SiN) film 14 is deposited as a first dielectric film to a thickness of thirty to three hundred nanometers (30–300 nm). The polysilicon film and the silicon nitride film are then patterned to form a polysilicon gate electrode 13 covered by a remaining part of the silicon nitride film 14. Another layer of silicon nitride is then deposited as a second dielectric film to a thickness of ten to sixty nanometers (10–60 nm) and patterned to leave sidewalls 15 covering the sides of the gate electrode 13 and silicon nitride film 14. These steps are carried out by well-known processes such as thermal oxidation, chemical vapor deposition (CVD), photolithography, and anisotropic etching.

Boron difluoride ($BF_2$) ions 16 are now implanted at an energy of thirty to sixty kiloelectron volts (30–60 keV) with a dosage of $10^{15}$ to $10^{16}$ per square centimeter, forming $p^+$ regions 17 in the substrate 10. Due to the large mass of the $BF_2$ ions, they do not penetrate far into the substrate 10, enabling shallow pn junctions to be formed. The $BF_2$ ions are not implanted into the gate electrode 13, which is masked by the silicon nitride film 14.

Figure 2:
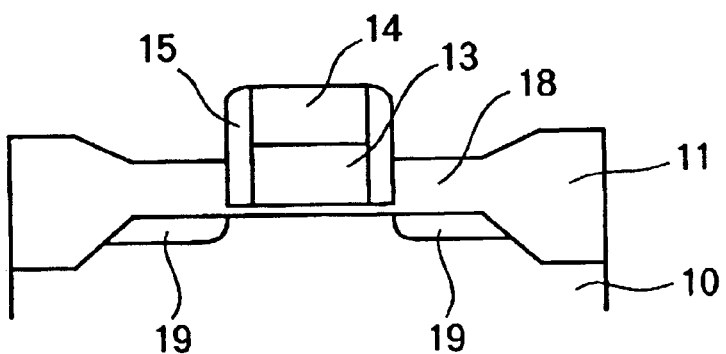

Referring to FIG. 2, as a third dielectric film, a silicon dioxide ($SiO_2$) film 18 with a thickness of thirty to one hundred nanometers (30–100 nm) is formed by oxidation of the wafer surface at a temperature of seven hundred to nine hundred degrees Celsius (700° C.–900° C.). The attendant heating of the substrate 10 drives in the implanted ions to form source and drain regions 19. Since silicon nitride is not easily oxidized, no silicon dioxide film 18 is formed on the silicon nitride film 14.

Figure 3:
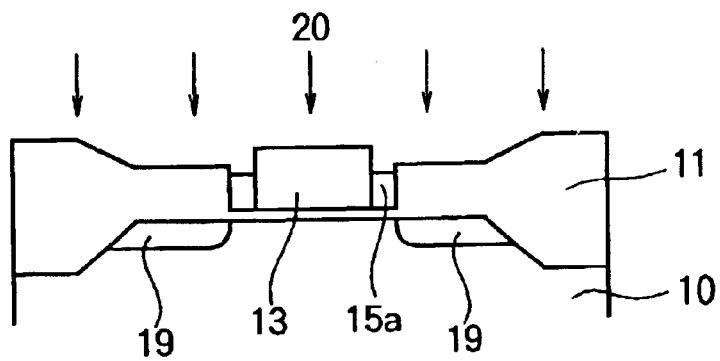

Referring to FIG. 3, the silicon nitride film 14 and sidewalls 15 are selectively etched in a phosphoric acid solution, which does not etch the silicon dioxide film 18 or the field oxide 11. The silicon nitride film 14 is entirely removed, exposing the surface of the gate electrode 13, and the height of the sidewalls 15 is reduced, leaving shortened sidewalls 15a. Boron ions 20 are now implanted at an energy of three to thirty kiloelectron volts (3–30 keV) with a dosage of $10^{15}$ to $10^{16}$ per square centimeter. At this energy, the boron ions 20 are implanted to an adequate depth in the gate electrode 13, but are blocked from the source and drain regions 19 by the silicon dioxide film 18. The wafer is then annealed at a temperature of seven hundred fifty to one thousand one hundred degrees Celsius (750° C.–1100° C.) for at most sixty minutes to drive in the boron ions. This process results in a fully doped gate electrode 13, with no depletion zone left near the gate oxide film 12.

Next, one or more layers of metal interconnections (not shown), with attendant interlayer dielectric films and contact and via holes (not shown), are formed by well-known methods to create an integrated circuit on the silicon wafer.

By separating the PMOSFET gate implementation from the source and drain implantation, the first embodiment enables the energy, dosage, and other parameters to be selected independently for each implantation process, and enables $BF_2$ ions to be used for the source and drain while boron ions are used for the gate. Accordingly, the two ion implantation processes can be independently optimized, making it possible to avoid short-channel effects while simultaneously avoiding unwanted boron contamination of the channel, and also avoiding the formation of an unwanted depletion zone at the bottom of the gate electrode 13.

PMOSFETs formed according to the first embodiment combine a high degree of uniformity in their threshold voltage and other electrical characteristics with high current driving performance, enabling integrated circuits incorporating these PMOSFETs to operate accurately and at high speed.

Next, a second embodiment of the invention will be described. The second embodiment replaces the silicon dioxide film 18 of the first embodiment with a CVD layer.

Figure 4:
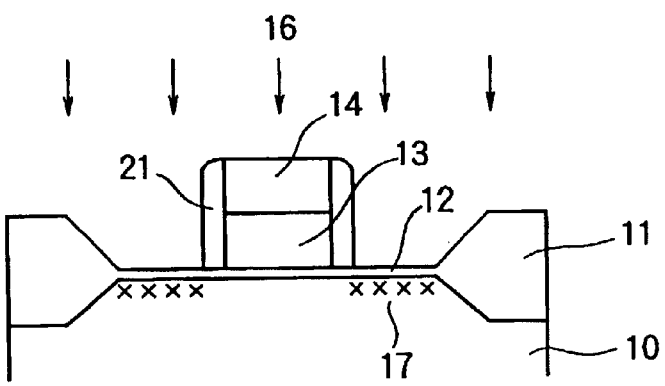
FIGS. 4, 5, 6, and 7 are sectional views illustrating four stages in the formation of a PMOSFET according to a second embodiment.

Referring to FIG. 4, in the second embodiment, a field oxide layer 11, a gate oxide film 12, a gate electrode 13 (100–500 nm thick), and a silicon nitride film 14 (30–300 nm thick) are formed as described in the first embodiment. A layer of silicon dioxide is then deposited by CVD to a thickness of 10–60 nm and patterned to leave inner sidewalls 21 covering the sides of the gate electrode 13 and silicon nitride film 14. After this step, $BF_2$ ions 16 are implanted at an energy of 30–60 keV with a dosage of $10^{15}$ to $10^{16}$ per square centimeter, forming $p^+$ regions 17 in the substrate 10 as in the first embodiment. During the $BF_2$ implantation step, the gate electrode 13 is masked by the silicon nitride film 14.

Figure 5:
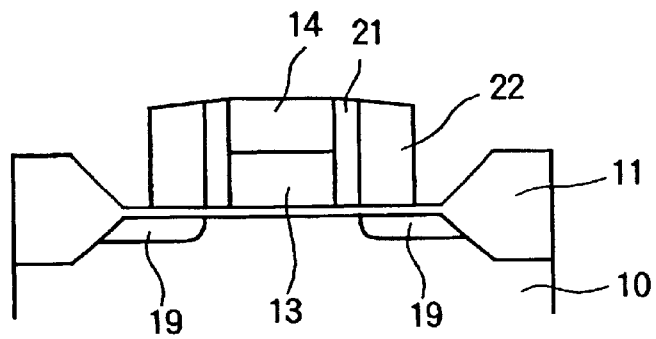

Referring to FIG. 5, the wafer is annealed at a temperature of 750° C.–1100° C. for at most sixty minutes to drive in the implanted ions and form source and drain regions 19. A silicon oxide film 50–150 nm thick is then deposited by CVD on the entire wafer surface, and is patterned by photolithography and etching. The etching process is an anisotropic etch that leaves outer sidewalls 22 covering the inner sidewalls 21, and covering the inner parts of the source and drain regions 19, while expecting the gate oxide film 12 in the outer parts of the source and drain regions 19. The outer sidewalls 22 function as the third dielectric film.

Figure 6:
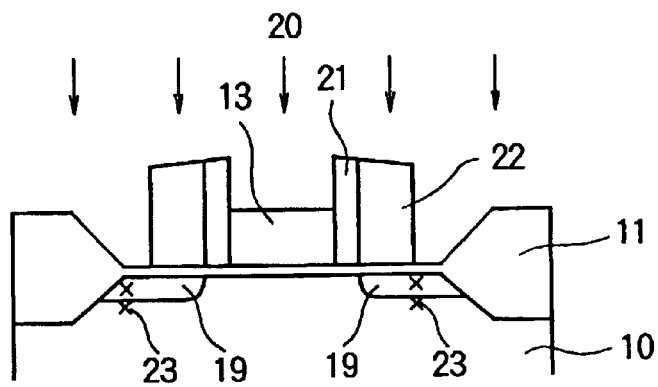

Referring to FIG. 6, the silicon nitride film 14 is now selectively etched in a phosphoric acid solution, which does not etch the sidewalls 21, 22, the gate oxide film 12, or the field oxide 11. Etching continues until the silicon nitride film 14 is entirely removed and the surface of the gate electrode 13 is exposed. Boron ions 20 are then implanted at an energy of 3–30 kEv with a dosage of $10^{15}$ to $10^{16}$ per square centimeter into the gate electrode 13, and into the outer parts of the source and drain regions 19. The boron inner 23 implanted into the source and drain regions 19 penetrate deeper than did the $BF_2$ ions 16 implanted in FIG. 4.

Figure 7:
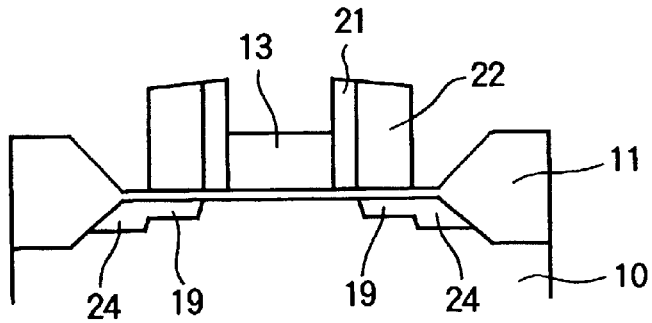

Referring to FIG. 7, the wafer is annealed at a temperature of 750° C.–1100° C. for at most sixty minutes to drive in the implanted boron ions. As in the first embodiment, this process results in a fully doped gate electrode 13, with no depletion zone left near the gate oxide film 12. In addition, comparatively deep outer source and drain regions 24 are formed, but since these comparatively deep regions are comparatively far removed from the channel region below the gate electrode 13, they do not produce short-channel effects.

Next, interlayer dielectric films, contact and via holes, and metal interconnections (not shown) are formed as in the first embodiment to complete the integrated circuit structure.

The second embodiment provides the same effects as the first embodiment in enabling the gate implantation process to be optimized independently of the source and drain implantation process. In addition, by using a CVD process to form the sidewalls 22 that function as the third dielectric film, the second embodiment avoids possible thermal damage to the source and drain regions 19, and avoids drawing carriers from the source and drain up into the oxide films. The second embodiment thus provides a method of forming PMOSFETs with high performance, uniform electrical characteristics, and a high fabrication yield.

Next, a third embodiment will be described.

Figure 8:
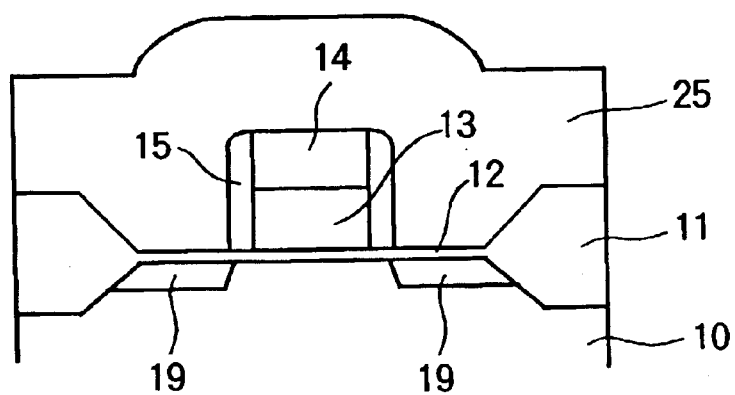
FIGS. 8, 9, and 10 are sectional views illustrating three stages in the formation of a PMOSFET according to a third embodiment.

Referring to FIG. 8, in the third embodiment, a field oxide layer 11, a gate oxide film 12, a gate electrode 13 (100–500 nm thick), a silicon nitride film 14 (30–300 nm thick), and silicon nitride sidewalls 15 (10–60 nm thick) are formed as described in the first embodiment. $BF_2$ ions 16 are implanted into the substrate 10 at an energy of 30–60 kEv with a dosage of $10^{15}$ to $10^{16}$ per square centimeter, as also described in the first embodiment, and the wafer is annealed to a temperature of 750° C.–1100° C. for at most sixty minutes to form the source and drain regions 19. Silicon oxide is then deposited by CVD to a thickness of three hundred to one thousand nanometers (300–1000 nm) on the entire wafer surface to form a silicon oxide film 25 as the third dielectric film.

Figure 9:
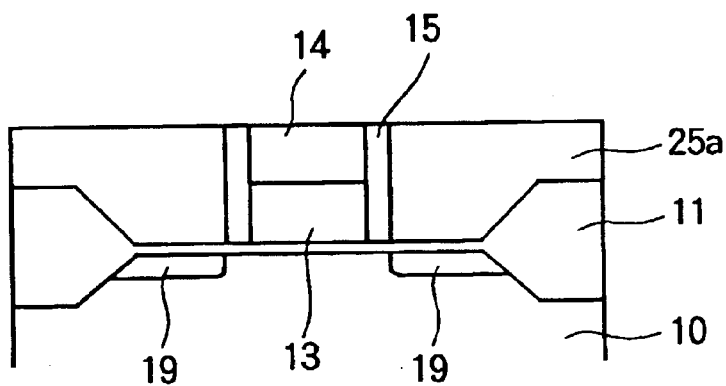

Referring to FIG. 9, the silicon oxide film 25 is planarized by chemical-mechanical polishing (CMP). The polishing process is continued until the surface of the silicon nitride film 14 is exposed. The source and drain regions 19 remain covered by the planarized silicon oxide film 25a.

Figure 10:
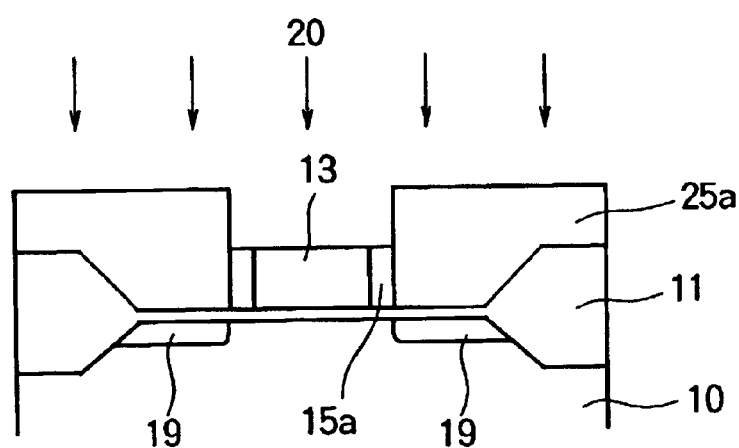

Referring to FIG. 10, the silicon nitride film 14 and sidewalls 15 are selectively etched in a phosphoric acid solution, which does not etch the silicon oxide film 25a. The silicon nitride film 14 is entirely removed, exposing the surface of the gate electrode 13, and the height of the sidewalls 15 is reduced, leaving shortened sidewalls 15a. Then boron ions 20 are implanted into the gate electrode 13 at an energy of 3–30 keV with a dosage of $10^{15}$ to $10^{16}$ per square centimeter, as in the first embodiment. The silicon oxide film 25a prevents the boron ions 20 from reaching the source and drain regions 19. The wafer is annealed at a temperature of 750° C.–1100° C. for at most sixty minutes to drive in the implanted boron ions, creating a fully doped gate electrode 13, with no depletion zone left near the gate oxide film 12.

Next, interlayer dielectric films, contact and via holes, and one or more layers or metal interconnections (not shown) are formed to complete the integrated circuit structure.

The third embodiment provides the same effects as the second embodiment: the gate implantation process and the source and drain implantation process can be independently optimized, and possible thermal damage to the source and drain regions 19 is avoided because the silicon oxide film 25 is deposited by CVD, producing PMOSFETs with high performance, uniform electrical characteristics, and a high fabrication yield.

Next, a fourth embodiment will be described. The fourth embodiment adds a lightly doped drain structure to the first embodiment.

Figure 11:
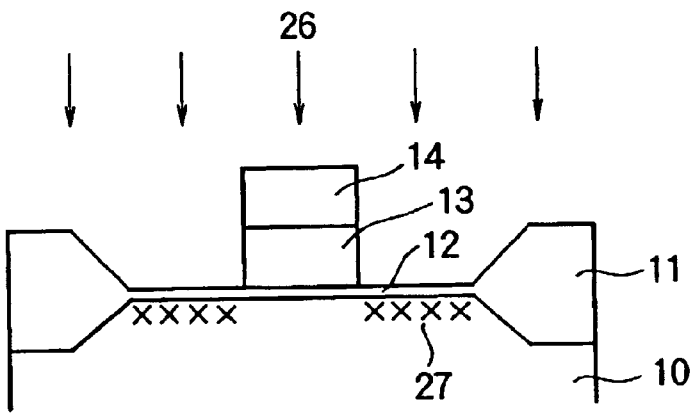
FIGS. 11, 12, 13, and 14 are sectional views illustrating four stages in the formation of a PMOSFET according to a fourth embodiment.

Referring to FIG. 11, in the fourth embodiment, a field oxide layer 11, a gate oxide film 12, a gate electrode 13 (100–500 mm thick), and a silicon nitride film 14 (30–300 nm thick) are formed as described in the first embodiment. $BF_2$ ions 26 are implanted into the substrate 10 at an energy of five to thirty kiloelectron volts (5–30) kEv with a dosage of $10^{12}$ to $10^{15}$ per square centimeter, forming very shallow, lightly doped p⁻ regions 27.

Figure 12:
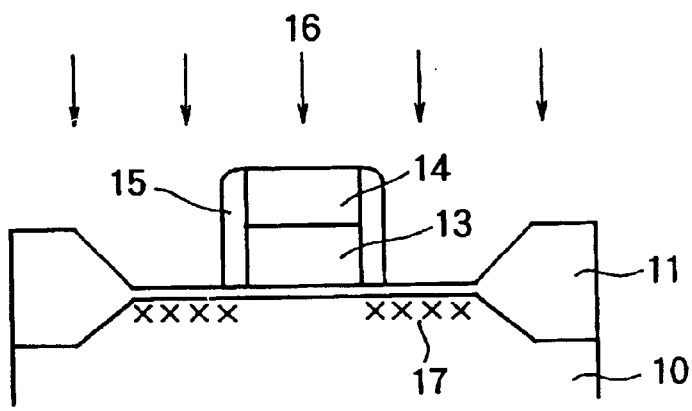

Referring to FIG. 12, a layer of silicon nitride 10–60 nm thick is now deposited by CVD and patterned by photolithography and anisotropic etching to form sidewalls 15. Further $BF_2$ ions 16 are implanted into the substrate 10 at an energy of 30–60 keV with a dosage of $10^{15}$ to $10^{16}$ per square centimeter to form shallow p⁺ regions 17 as described in the first embodiment.

During the ion implantation processes in FIGS. 11 and 12, the silicon nitride film 14 acts as a mask so that no $BF_2$ is implanted into the gate electrode 13.

Figure 13:
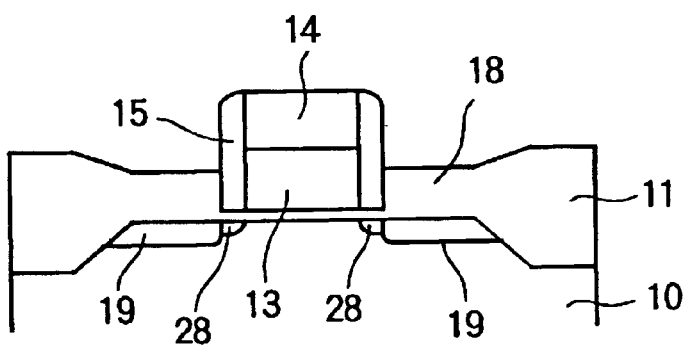

Referring to FIG. 13, an $SiO_2$ film 18 with a thickness of 30–100 nm is formed as in the first embodiment by oxidation of the wafer surface at a temperature of 700° C.–900° C. During this process, the $BF_2$ ions implanted in the substrate 10 are driven in to form source and drain regions 19 and a lightly doped drain region (LDD) 28. A similar lightly doped region is formed on the source side, making the source and drain interchangeable.

Figure 14:
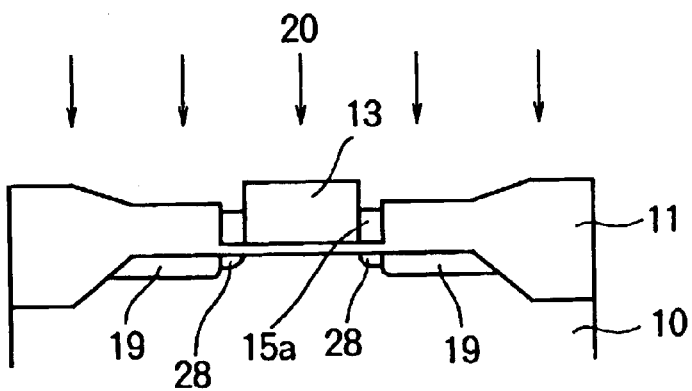

The remaining fabrication steps are carried out as in the first embodiment. Referring to FIG. 14, the silicon nitride film 14 and sidewalls 15 are selectively etched in a phosphoric acid solution, exposing the upper surface of the gate electrode 13 and leaving shortened sidewalls 15a. Boron ions 20 are implanted into the gate electrode 13 at an energy of 3–30 kEV with a dosage of $10^{15}$ to $10^{16}$ per square centimeter, the silicon dioxide film 18 masking the source and drain regions 19. The wafer is then annealed at a temperature of 750° C.–1100° C. for at most sixty minutes to drive in the implanted boron ions, resulting in a fully doped gate electrode 13 with no depletion zone left near the gate oxide film 12. Finally, interlayer dielectric films, contact and via holes, and metal interconnections (not shown) are formed to complete the fabrication process.

The fourth embodiment provides the same effects as the first embodiment. In addition, the lightly doped drain 28 prevents carriers from being abruptly accelerated at the interface between the channel and drain, thereby avoiding hot-carrier damage which can alter the threshold voltage, transconductance, and other electrical characteristics during the lifetime of the PMOSFET, as is well known.

The fourth embodiment thus yields PMOSFETs having high reliability, as well as high performance and uniform electrical characteristics. Compared with the first embodiment, the fourth embodiment requires only one additional fabrication step, this being the implantation of $BF_2$ ions 26 before the formation of the sidewalls 15.

Next, a fifth embodiment will be described. The fourth embodiment adds a lightly doped drain structure to the second embodiment.

Figure 15:
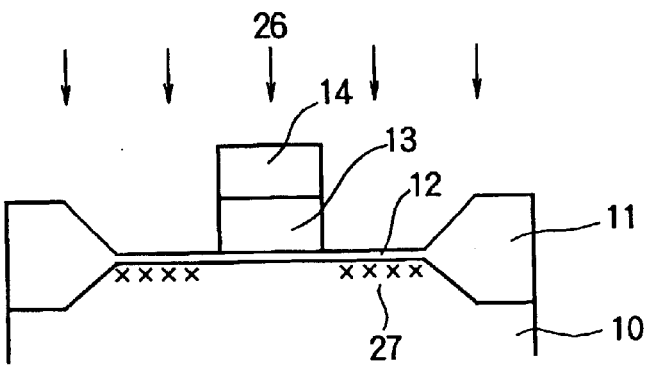
FIGS. 15, 16, 17, 18, and 19 are sectional views illustrating five stages in the formation of a PMOSFET according to a fifth embodiment.

The initial fabrication steps in the fifth embodiment are the same as in the fourth embodiment. Referring to FIG. 15, a field oxide layer 11, a gate oxide film 12, a gate electrode 13 (100–500 nm thick), and a silicon nitride film 14 (30–300 nm thick), are formed, and $BF_2$ ions 26 are implanted at an energy of 5–30 kEv with a dosage of $10^{12}$ to $10^{15}$ per square centimeter, forming very shallow p⁻ regions 27 in the substrate 10.

Figure 16:
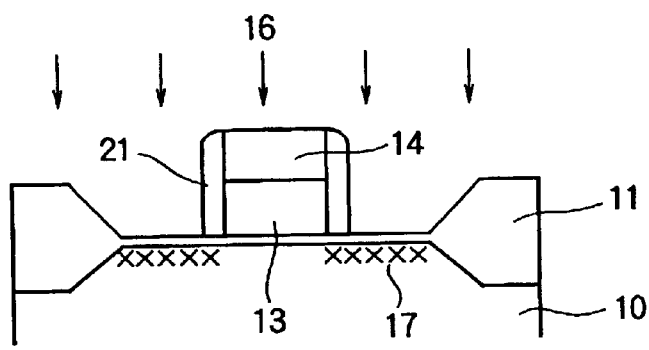
Figure 17:
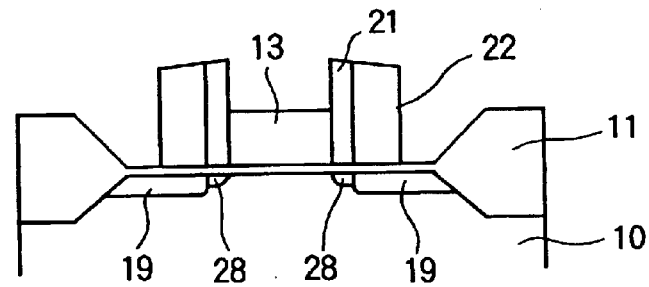

Referring to FIG. 16, a layer of silicon oxide 10–60 nm thick is now deposited by CVD and patterned by photolithography and an anisotropic etching process to form sidewalls 21, as in the second embodiment. Further $BF_2$ ions 16 are implanted into the substrate 10 at an energy of 30–60 kEv with a dosage of $10^{15}$ to $10^{16}$ per square centimeter to form shallow p+ regions 17. Referring to FIG. 17, the wafer is annealed at a temperature of 750° C.–1100° C. for at most sixty minutes to form source and drain regions 19 and a lightly doped drain region 28.

Figure 18:
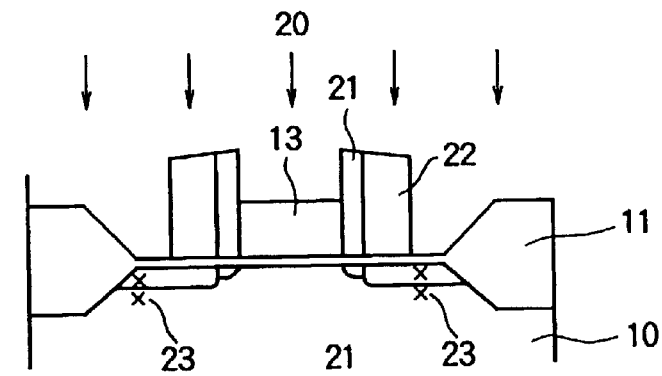
Figure 19:
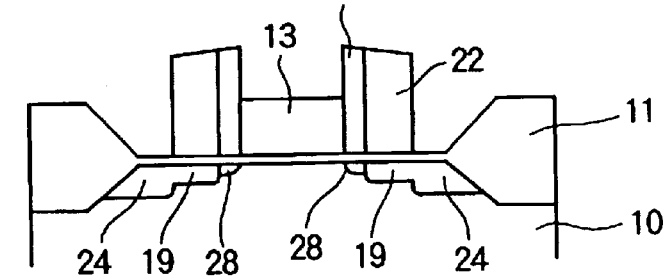

The remaining fabrication steps are identical to the corresponding steps in the second embodiment. A silicon oxide layer 50–150 nm thick is deposited by CVD on the entire wafer surface and patterned by an anisotropic etching process to leave outer sidewalls 22 covering the inner sidewalls 21 and the inner parts of the source and drain regions 19. Referring to FIG. 18, the silicon nitride film 14 is selectively etched in a phosphoric acid solution until the surface of the gate electrode 13 is exposed. Boron ions 20 are implanted at an energy of 3–30 kEv with a dosage of $10^{15}$ to $10^{16}$ per square centimeter into the gate electrode 13, and into the outer parts of the source and drain regions 19. Referring to FIG. 19, the wafer is annealed at a temperature of 750° C.–1100° C. for at most sixty minutes to drive in the implanted boron ions, creating a fully doped gate electrode 13, and comparatively deep outer source and drain regions 24. Finally, interlayer dielectric films, contact and via holes, and metal interconnections (not shown) are formed to complete the integrated circuit structure.

The fifth embodiment combines the effects of the second and fourth embodiments, avoiding thermal damage during the fabrication process and hot-carrier damage in the field and producing PMOSFETs with uniform electrical characteristics, high performance, high yield, and high reliability.

Next, a sixth embodiment will be described. The sixth embodiment adds a lightly doped drain structure to the third embodiment.

Figure 20:
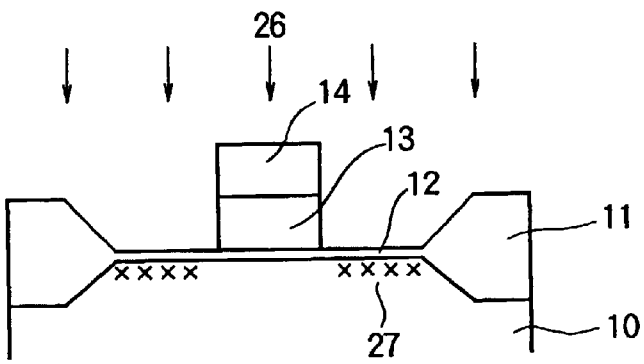
FIGS. 20, 21, 22, 23, and 24 are sectional views illustrating five stages in the formation of a PMOSFET according to a sixth embodiment.
Figure 21:
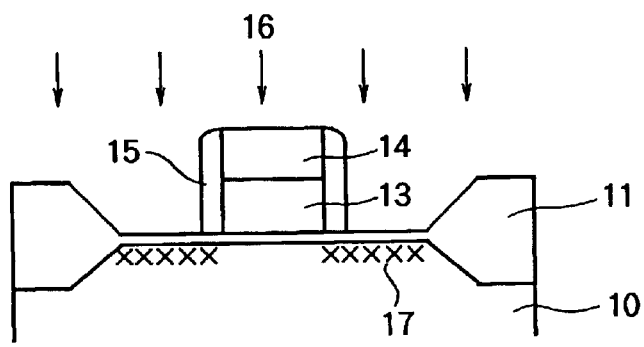
Figure 22:
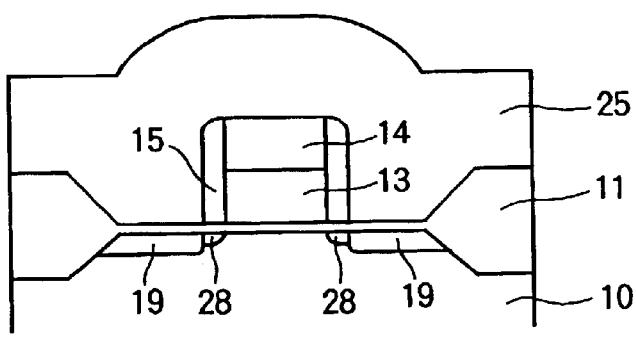

The initial fabrication steps in the sixth embodiment are the same as in the fourth embodiment. Referring to FIG. 20, a field oxide layer 11, a gate oxide film 12, a gate electrode 13 (100–500 nm thick), and a silicon nitride film 14 (30–300 nm thick) are formed, and $BF_2$ ions 26 are implanted at an energy of 5–30 keV with a dosage of $10^{12}$ to $10^{15}$ per square centimeter, forming very shallow p− regions 27 in the substrate 10. Referring to FIG. 21, a layer of silicon nitride 10–60 nm thick is deposited by CVD and patterned by an anisotropic etching process to form sidewalls 15, and further $BF_2$ ions 16 are implanted into the substrate 10 at an energy of 30–60 kEv with a dosage of $10^{15}$ to $10^{16}$ per square centimeter to form shallow p+ regions 17. Referring to FIG. 22, the wafer is annealed at a temperature of 750° C.–1100° C. for at most sixty minutes to form source and drain regions 19 and a lightly doped drain region 28.

Figure 23:
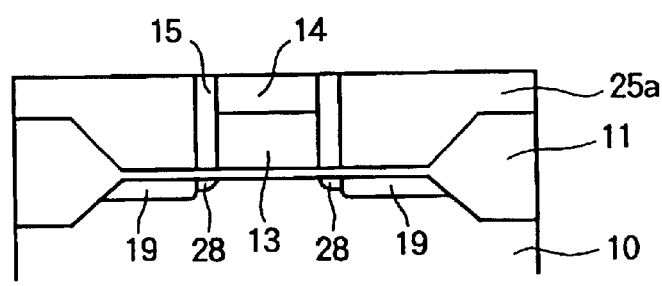
Figure 24:
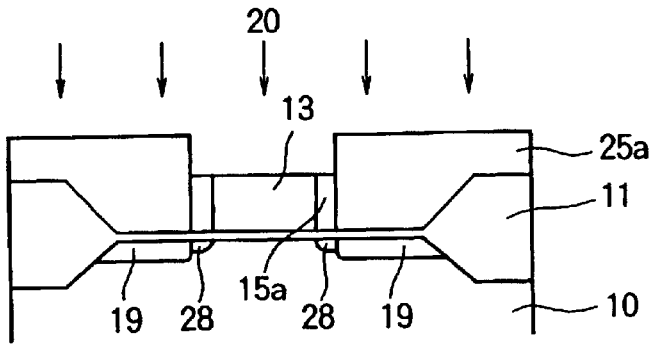
Figure 25:
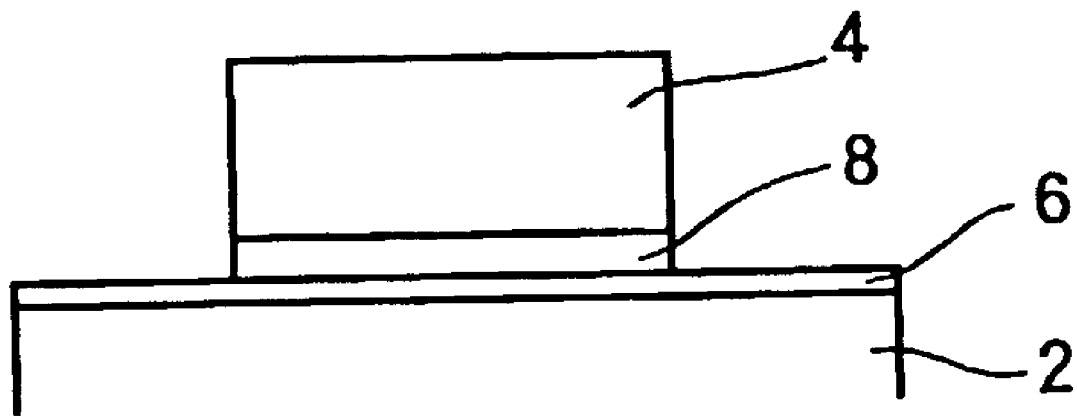
FIG. 25 is a sectional view of a conventional PMOSFET.

The remaining fabrication steps are identical to the corresponding steps in the third embodiment. A silicon oxide film 25 is deposited to a thickness of 300–1000 nm on the entire wafer surface by CVD. Referring to FIG. 23, the silicon oxide film 25 is planarized by CME to expose the surface of the silicon nitride film 14. Referring to FIG. 24, the silicon nitride film 14 and sidewalls 15 are selectively etched in a phosphoric acid solution, exposing the surface of the gate electrode 13 and leaving shortened sidewalls 15a. Boron ions 20 are then implanted into the gate electrode 13 at an energy of 3–30 kEv with a dosage of $10^{15}$ to $10^{16}$ per square centimeter, the silicon oxide film 25a masking the source and drain regions 19 and the sidewalls 15a masking the lightly doped drain regions 28. The wafer is annealed at a temperature of 750° C.–1100° C. for at most sixty minutes to drive in the implanted boron ions, creating a fully doped gate electrode 13. Interlayer dielectric films, contact and via holes, and metal interconnections (not shown) are then formed to complete the device structure.

The sixth embodiment combines the effects of the third and fourth embodiments, avoiding thermal damage during the fabrication process and hot-carrier damage in the field and producing MOSFETs with uniform electrical characteristics, high performance, high yield, and reliability.

The invention is not limited to the structures, materials, and processes described in the embodiments above. In the second, third, fifth, and sixth embodiments, for example, the $BF_2$ ions implanted into the substrate 10 and the boron ions implanted into the gate electrode 13 can be driven in by the same annealing process, instead of by two separate annealing processes.

In the third and sixth embodiments, the sidewalls 15 may be formed from silicon oxide instead of silicon nitride. The sidewalls 15 then remain intact when the silicon nitride film 14 is etched.

The silicon oxide film 25 in the third and sixth embodiments may be etched back to expose the surface of the gate electrode 13, instead of being planarized by CMP.

The materials of the film covering the gate electrode 13 and the film masking the source and drain regions in the third and sixth embodiments may be interchanged: the silicon nitride film 14 may be replaced by a silicon oxide film as the first dielectric film, and the silicon oxide film 25 may be replaced by a silicon nitride film as the third dielectric film. In this case, a hydrofluoric acid solution can be used to etch the silicon-oxide first dielectric film and expose the surface of the gate electrode 13.

In any of the embodiments, the gate electrode 13 may be formed from amorphous silicon instead of polysilicon.

The first and third impurities implanted into the source and drain regions are not limited to boron difluoride, and the second impurity implanted into the gate electrode is not limited to boron. For example, boron difluoride ions may be implanted as the second impurity, and boron ions as the third impurity.

Those skilled in the art will recognize that further variations are possible within the scope of the invention, which is defined by the appended claims.

What is claimed is:

1. A method of forming a field-effect transistor in a semiconductor device having a semiconductor substrate, comprising:

forming a gate oxide film on the substrate;

depositing a layer of a semiconductor material on the gate oxide film;

forming a first dielectric film on the layer of said semicondutor material;

patterning the layer of said semiconductor material and the first dielectric film to form a gate electrode covered by a remaining part of the first dielectric film;

depositing and patterning a second dielectric film to form sidewalls on the gate electrode and the remaining part of the first dielectric film;

implanting a first impurity into the substrate to form source and drain regions;

forming a third dielectric film masking at least parts of the source and drain regions adjacent the gate electrode, while exposing the remaining part of the first dielectric film;

etching and thereby removing the remaining part of the first dielectric film;

implanting a second impurity into the gate electrode; and implanting a third impurity into the substrate after patterning the first dielectric film, before depositing the second dielectric film.

2. The method of claim 1, wherein said semiconductor material is polysilicon.

3. The method of claim 1, wherein the first impurity is boron difluoride.

4. The method of claim 1, wherein the second impurity is boron or boron difluoride.

5. The method of claim 1, wherein the third impurity is boron or boron difluoride.

6. A method of forming a field-effect transistor in a semiconductor device having a semiconductor substrate, comprising:

forming a gate oxide film on the substrate;

depositing a layer of a semiconductor material on the gate oxide film;

forming a first dielectric film on the layer of said semiconductor material;

patterning the layer of said semiconductor material and the first dielectric film to form a gate electrode covered by a remaining part of the first dielectric film;

depositing and patterning a second dielectric film to form sidewalls on the gate electrode and the remaining part of the first dielectric film;

implanting a first impurity into the substrate to form source and drain regions;

forming a third dielectric film masking at least parts of the source and drain regions adjacent the gate electrode, while exposing the remaining part of the first dielectric film;

etching and thereby removing the remaining part of the first dielectric film; and implanting a second impurity into the gate electrode, wherein the first dielectric film and the second dielectric film are nitride films, and the third dielectric film is an oxide film formed by surface oxidation of the substrate.

7. A method of forming a field-effect transistor in a semiconductor device having a semiconductor substrate, comprising:

forming a gate oxide film on the substrate;

depositing a layer of a semiconductor material on the gate oxide film;

forming a first dielectric film on the layer of said semiconductor material;

patterning the layer of said semiconductor material and the first dielectric film to form a gate electrode covered by a remaining part of the first dielectric film;

depositing and patterning a second dielectric film to form sidewalls on the gate electrode and the remaining part of the first dielectric film;

implanting a first impurity into the substrate to form source and drain regions;

forming a third dielectric film masking at least parts of the source and drain regions adjacent the gate electrode, while exposing the remaining part of the first dielectric film;

etching and thereby removing the remaining part of the first dielectric film; and implanting a second impurity into the gate electrode, wherein forming the third dielectric film comprises patterning the third dielectric film to form outer sidewalls covering the sidewalls formed by the second dielectric film.

8. The method of claim 7, wherein the first dielectric film is a nitride film and the third dielectric film is an oxide film.

9. The method of claim 8, wherein the third dielectric film is formed by chemical vapor deposition.

10. The method of claim 8, wherein the second dielectric film is an oxide film.

11. The method of claim 10, wherein the second dielectric film is formed by chemical vapor disposition.

12. A method of forming a field-effect transistor in a semiconductor device having a semiconductor substrate, comprising:

forming a gate oxide film on the substrate;

depositing a layer of a semiconductor material on the gate oxide film;

forming a first dielectric film on the layer of said semiconductor material;

patterning the layer of said semiconductor material and the first dielectric film to form a gate electrode covered by a remaining part of the first dielectric film;

depositing and patterning a second dielectric film to form sidewalls on the gate electrode and the remaining part of the first dielectric film;

implanting a first impurity into the substrate to form source and drain regions;

forming a third dielectric film masking at least parts of the source and drain regions adjacent the gate electrode, while exposing the remaining part of the first dielectric film;

etching and thereby removing the remaining part of the first dielectric film; and implanting a second impurity into the gate electrode, wherein forming the third dielectric film comprises planarizing the third dielectric film to expose the remaining part of the first dielectric film.

13. The method of claim 12, wherein planarizing the third dielectric film comprises chemical-mechanical polishing.

14. The method of claim 12, wherein the first dielectric film is a nitride film and the third dielectric film is an oxide film.

15. The method of claim 12, wherein the first dielectric film is an oxide film and the third dielectric film is a nitride film.

16. The method of claim 12, wherein the third dielectric film is formed by chemical vapor deposition.

17. The method of claim 12, wherein the second dielectric film is a nitride film.

18. The method of claim 12, wherein the second dielectric film is an oxide film.

19. The method of claim 12, wherein the second dielectric film is formed by chemical vapor deposition.

* * * * *